United States Patent [19]

Cox

[11] 4,204,893

[45] May 27, 1980

[54] PROCESS FOR DEPOSITING CHROME DOPED EPITAXIAL LAYERS OF GALLIUM ARSENIDE UTILIZING A PRELIMINARY FORMED CHEMICAL VAPOR-DEPOSITED CHROMIUM OXIDE DOPANT SOURCE

[75] Inventor: Herbert M. Cox, Hackettstown, N.J.

[73] Assignee: Bell Telephone Laboratories, Incorporated, Murray Hill, N.J.

[21] Appl. No.: 12,713

[22] Filed: Feb. 16, 1979

[51] Int. Cl.$^2$ .................. H01L 21/205; H01L 21/84
[52] U.S. Cl. .......................... 148/175; 29/571; 148/174; 156/605; 156/612; 252/62.3 GA; 357/15; 357/22; 357/23; 357/58; 357/63; 357/64; 427/85.
[58] Field of Search .................... 148/174, 175; 252/62.3 GA; 29/571; 357/15, 22, 58, 23, 63, 64; 427/85, 86; 156/605, 612

[56] References Cited

U.S. PATENT DOCUMENTS

| 3,492,175 | 1/1970 | Conrad et al. | 148/175 |
| 3,657,615 | 4/1972 | Driver | 357/15 |
| 3,729,341 | 4/1973 | Dietz et al. | 148/175 X |
| 3,912,546 | 10/1975 | Hunsperger et al. | 357/22 X |
| 4,075,651 | 2/1978 | James | 357/64 X |

OTHER PUBLICATIONS

Bass, S. J., "Device Quality Epitaxial Gallium Arsenide . . .", J. Crystal Growth, v. 31, 1975, pp. 172–178.
Thorsen et al., "Material and Device . . . Heteroepitaxial GaAs . . .", Solid–State Electronics, vol. 17, 1974, pp. 855–862.

Primary Examiner—L. Dewayne Rutledge
Assistant Examiner—W. G. Saba
Attorney, Agent, or Firm—Bruce S. Schneider

[57] ABSTRACT

A method for reliably producing epitaxial layers of chrome doped gallium arsenide having excellent physical and electrical characteristics is disclosed. The process relies on the use of a specific dopant source for supplying chromium containing entities through the composition used in chemical vapor deposition (CVD) of gallium arsenide. The dopant source is obtained by chemical vapor deposition of a chromium oxide. This dopant is then utilized in a CVD process by flowing a reactive gas such as AsCl$_3$ over the precipitate to form volatile chromium containing compounds which are combined with a GaAs CVD composition. The insulating gallium arsenide layers thus obtained have excellent electrical properties, resistivities greater than 10$^3$ ohm-cm and exhibit no discernible particle induced surface irregularities.

7 Claims, 3 Drawing Figures

PROCESS FOR DEPOSITING CHROME DOPED EPITAXIAL LAYERS OF GALLIUM ARSENIDE UTILIZING A PRELIMINARY FORMED CHEMICAL VAPOR-DEPOSITED CHROMIUM OXIDE DOPANT SOURCE

BACKGROUND OF THE INVENTION

1. Field of the Invention

This invention relates to chemical vapor deposition (CVD) of epitaxial semi-insulating layers and, more particularly, to deposition of semi-insulating gallium arsenide layers.

2. Art Background

Gallium arsenide epitaxial layers are used in a wide variety of semiconductor devices. Semi-insulating layers of GaAs are often used as buffer layers between a substrate and active semiconductor region of a device. For example, GaAs based field effect transistors (FETs) are manufactured with a semi-insulating layer of epitaxial GaAs between a single crystal substrate and an epitaxial active region of n-type GaAs. This semi-insulating epitaxial layer is grown using conventional techniques such as chemical vapor deposition (CVD). During the deposition process a deep acceptor dopant is introduced into the chemical vapor flow containing an n-type GaAs deposition precursor—a gas phase composition which leads to deposition of n-type GaAs when contacted with a substrate heated to an appropriate temperature. (Deep acceptors are those having energy levels near the midgap energy of the particular semiconductor material.)

These intermediary semi-insulating epitaxial layers serve two important functions. The substrate, even after the initial cleaning process, invariably has residual contamination. If the active layer is deposited directly on this contaminated surface, its electrical properties are degraded. When a semi-insulating intermediary layer is deposited on the substrate, and the active layer is subsequently deposited on the intermediary layer, this contamination does not occur. The intermediary layer is sufficiently thick to prevent the contamination from diffusing into the active region. Since the active region is deposited on the intermediary layer without removing the substrate from the deposition apparatus, there is no possibility of contamination at the active region/intermediary region interface.

A second advantage in using an intermediary layer is also attained. Active regions grown directly on the substrate usually yield degraded device characteristics. These properties arise from undesirable interface states which occur at the interface with the substrate. By removing the active region from the substrate/epitaxial layer interface, degradation of electrical properties resulting from these states are substantially reduced.

These advantageous semi-insulating layers must, depending on the application, satisfy certain criteria to maintain device properties. For example, for FETs the intermediary layer must be highly resistive to prevent leakage currents in the device ultimately manufactured which result from current flow through this layer. Typically, resistivities greater than $10^3$ ohm-cm preferably greater than $10^6$ ohm-cm are desired for applications such as FETs. A deep acceptor dopant is introduced into the normally n-type GaAs so that semi-insulating properties are achievable. This dopant must have the properties that (1) sufficient concentrations can be employed so that the desired resistivity is attained, (2) substantial interference with the growth of a sufficiently regular surface does not occur and (3) adaptability to conventional techniques such as CVD is possible.

For many applications such as GaAs FETs, a chromium dopant has been employed to provide sufficient resistivities for intermediary semi-insulating GaAs layers. The layers produced typically have resistivities in the range $10^3$ to $10^{10}$ ohm-cm. Despite the advantages of using a chromium containing dopant, a convenient method of introducing this dopant into the GaAs epitaxial intermediary layer has not yet been found. For example, attempts to chromium dope GaAs layers have been made by using a $CrO_2Cl_2$ source. In this method, an inert gas or a gas which reduces $CrO_2Cl_2$ such as helium or hydrogen respectively is passed through a bubbler containing the $CrO_2Cl_2$. The carrier gas with its fraction of $CrO_2Cl_2$ is then passed through an entry tube into the deposition apparatus. However, $CrO_2Cl_2$ decomposes at the processing temperatures required for the GaAs deposition. Therefore, particulate decomposition fragments form. This particulate matter either adheres onto the walls of the dopant entry tube or enters the reaction chamber. The portion entering the reaction chamber can fall into the growing epitaxial layer and produce unacceptable surface irregularities. Additionally, chromium particulate matter remains in the reaction chamber after growth of the intermediary epitaxial layer is finished. The semiconducting active region is then grown without venting the system to prevent the contamination problems discussed earlier. However, since chromium entities remain in the reaction chamber they can be incorporated in the active region and degrade its semiconducting properties.

Thus, although chromium is a desirable dopant for producing semi-insulating GaAs intermediate layers, it is associated with contamination and undesirable surface features.

SUMMARY OF THE INVENTION

A chromium dopant source has been found which leads to chromium doped semi-insulating GaAs with excellent surface characteristics. This dopant source is obtained by producing chromium oxide by chemical vapor deposition, i.e., deposition of chromium oxide by reaction at a heated surface. This is accomplished for example by decomposing $CrO_2Cl_2$ on the heated inlet tube. When the CVD deposition of chromium oxide is substantially completed, a gas such as $AsCl_3$ which reacts with chromium oxides to form a volatile compound is then passed over this solid decomposition product. The gas flow containing the volatile reactant products is introduced with the normal GaAs CVD gas flow above the substrate. Epitaxial layers having resistivities greater than $10^3$ have been produced with surfaces appearing essentially free of surface defects induced by particulate matter.

The decomposition of $CrO_2Cl_2$ for one minute produces sufficient material to supply adequate dopant for approximately 50 epitaxial layer growths. The epitaxial layers obtained have quite acceptable surface characteristics. Other methods which attempt to simulate this result by utilizing powdered $Cr_2O_3$ instead of the CVD produced chromium oxide have been unsuccessful. Therefore, the dopant system prescribed seems to be unusually suitable for deposition of chromium doped GaAs epitaxial layers.

DETAILED DESCRIPTION

Figure 1:
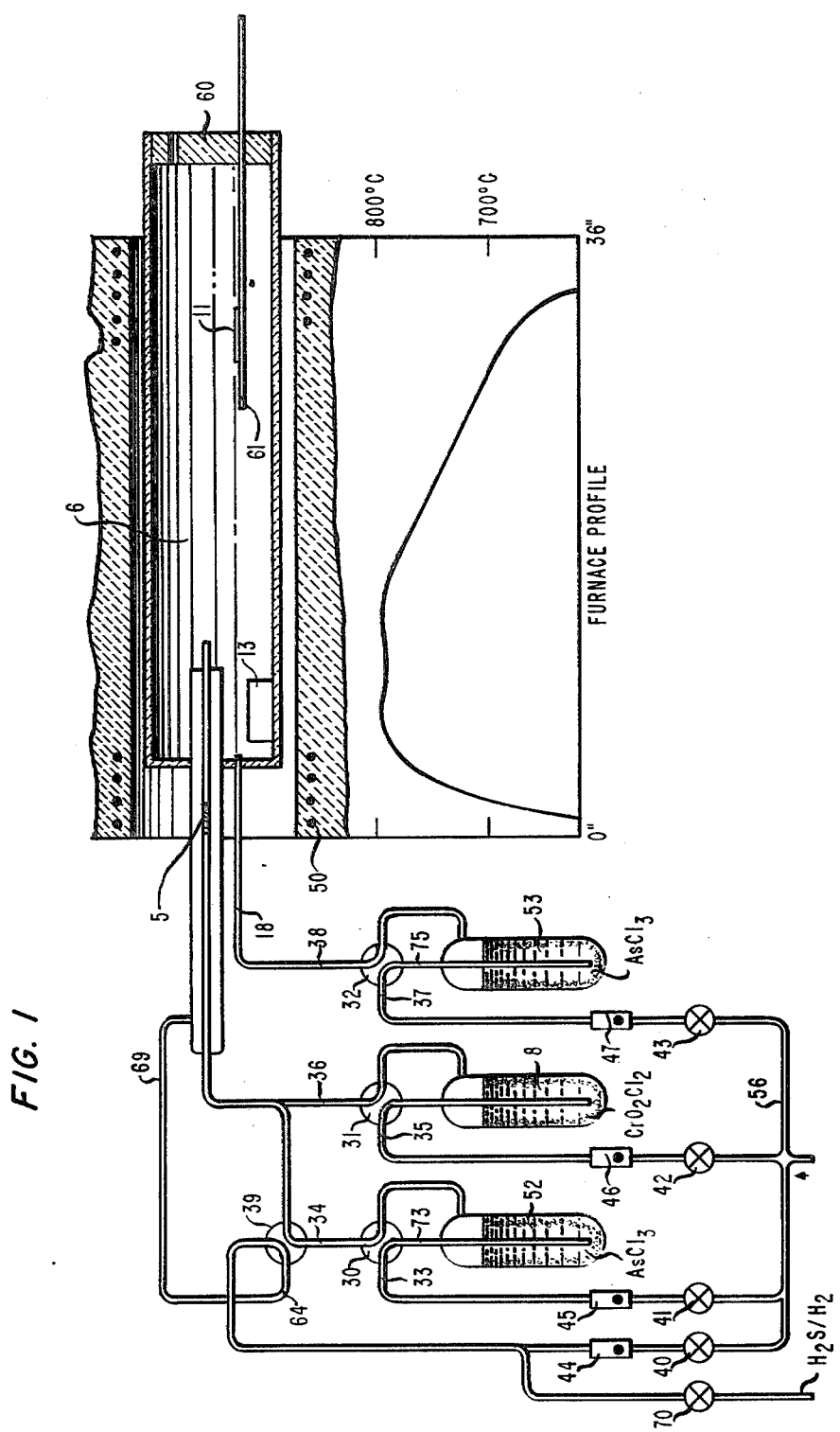
FIG. 1 is a schematic representation of an apparatus sutiable for the practice of the subject process.

In one embodiment of the subject invention, the apparatus represented in FIG. 1 is utilized. The dopant source is obtained by CVD deposition of chromium oxide on the interior wall of an inlet, 5, to the reaction chamber, 6. This deposition is advantageously accomplished, for example, by first bubbling an inert or reducing gas through $CrO_2Cl_2$ using conventional bubbler system, 8. (An inert gas as used in this context means a gas which does not react with $CrO_2Cl_2$.) The $CrO_2Cl_2$ laden gas is then directed into the inlet tube, 5. The reaction chamber is heated before the inert gas flow is begun. The profile of the temperatures is typically in the form shown in FIG. 1. The temperatures reached in the inlet tube should be sufficient to decompose $CrO_2Cl_2$ in the inlet tube before it reaches the reaction chamber. Decomposition temperatures vary with flow rate and bubbler temperature. Typically, temperatures above 300 degrees C. in the inlet tube are sufficient for decomposition. In a preferred embodiment these temperatures are produced by using a temperature profile such as shown in FIG. 1 with a peak temperature above 600 degrees C. This decomposition need not be extensive. For example, a one minute decomposition period for a gas flow of 60 cc/min and a bubbler temperature of 0 degrees C. yields a sufficient quantity of dopant source for 50 average growth procedures. Typically, gas flows over the chromium oxide deposition surface between 10 cc/min and 200 cc/min and bubbler temperatures in the range −10 degrees C. to 25 degrees C. with a gas flow through the bubbler in the range 5 cc/min to 100 cc/min are suitable and yield adequate quantities of the decomposed product in acceptable time periods. It should be noted that decomposition time periods insufficient to produce visible amounts of decomposition product do produce sufficient chromium oxide for a limited number of runs. For example, a chromium oxide CVD period of 6 seconds with flow rate 20 cc/min and bubbler temperature 0 degrees C. (bubbler flow rate 10 cc/min) produces sufficient dopant for 5 runs. This is quite adequate if a limited number of runs are contemplated.

The use of the heat from the reaction chamber itself to decompose the $CrO_2Cl_2$ and induce chemical vapor deposition is a convenient procedure for producing the necessary dopant source. However, this procedure is not the only one possible. For example, the inert gas flow from the bubbler can be directed through a tube which is heated in a separate oven to temperatures above 300 degrees C., to produce the necessary decomposition and precipitation of a dopant source. The tube with its dopant source is then transferred from the oven to the deposition apparatus and inserted as inlet tube, 5. The first essential criterion is that chromium oxide be deposited by chemical vapor deposition to yield a solid deposit on a surface. The deposit with its underlying surface is positioned so that a gas flow can be passed over it at a suitable temperature into the reaction chamber. By using this technique, it is possible to essentially eliminate formation of particulate matter such as decomposed $CrO_2Cl_2$ in the reaction chamber. A second requirement is that a composition which reacts with chromium oxide to form volatile chromium compositions be introduced after essentially all the CVD formation of the dopant source is complete. It is possible to satisfy this requirement in a variety of ways. For example, the dopant source is formed before the deposition process substantially begins.

Also, during the GaAs deposition process it is possible to form a small amount of dopant source—sufficient to sustain the doping level—and still satisfy this second requirement. (As indicated above small quantities of dopant source are sufficient for limited deposition runs and can be formed in quite short time periods.) During the run the chromium oxide dopant source is formed in the absence of a reactive gas which forms volatile chromium compounds. After essentially all the dopant source has formed, the reactive gas is then passed over it. The GaAs continues to grow during this period. However, as discussed, it is possible to limit the interval of dopant source deposition. Since no reactive gas is introduced over the dopant source during its growth and since the GaAs layer continues to grow, a small area of undoped GaAs is developed in the GaAs body. However, for short intervals, e.g., less than 5 minutes, no noticeable degradation occurs.

In the growth procedure the substrate, typically a wafer, 11, cut from a bulk crystal of GaAs, is positioned on the substrate holder, 61. The chamber is purged during substrate insertion with an inert gas such as helium to prevent combustion of residual gases. In a preferred embodiment, a temperature contour is then established in the furnace so that the gallium source, 13, is held at a temperature in the range 700 degrees C. to 850 degrees C., preferably in the range 780 degrees C. to 820 degrees C., and the substrate is held at a temperature in the range 600 degrees C. to 800 degrees C., preferably in the range 675 degrees C. to 750 degrees C. The substrate and source temperature are to a certain extent interdependent and a controlled sample is used to determine the best combination. A GaAs deposition precursor is then formed by conventional techniques, e.g., a gas flow comprising a mixture of $AsCl_3/H_2$ is introduced through an inlet tube, 18, and passed over a gallium source, 13. The flow rate, mole fraction of $AsCl_3/H_2$, and gallium source temperature determine the properties of the deposited GaAs layer. These reaction parameters should be advantageously adjusted for FET applications so that the inherent background level, i.e., $N_D$-$N_A$ is in the range $1\times10^{13}$ to $1\times10^{16}$ preferably $1\times10^{14}$ to $1\times10^{15}$. Typically, to obtain background levels in this range, the temperature specified above for source and substrate are utilized. Additionally, $AsCl_3/H_2$ mixtures having a mole fraction of $AsCl_3$ in the range $10^{-4}$ to $10^{-1}$ are employed with a total flow rate in the range 200 cc/min to 1000 cc/min, preferably 600 cc/min to 800 cc/min for a reactor tube of approximately 5 cm diameter.

Obviously, since the result to be achieved is a doped GaAs layer the background levels in the finally deposited layer are not measured. However, to set the reaction conditions to achieve a background level in the desired range, a controlled sample is utilized. A sample substrate is placed in the substrate holder and reaction conditions within the above range are initiated. The background level of the deposited GaAs is then monitored by measuring the capacitance of the deposited layer versus an applied voltage. (The background level for a given voltage and capacitance is calculated as described in G. L. Miller, *IEEE TRANS. ELECTRON DEVICES*, ED-19, 1103 (1972).) The reaction conditions are adjusted until the desired inherent background level is obtained. Future deposition runs are then made using these determined reaction conditions.

In a preferred embodiment, a gas flow is initiated over the gallium source and over the dopant source. The gas flow over the decomposed $CrO_2Cl_2$, i.e., the dopant source, comprises a mixture of an inert gas or a reducing gas such as hydrogen with a vapor or gas which reacts with chromium oxides to produce volatile chromium compounds. For example, $AsCl_3$ has been found advantageous. Since the $AsCl_3$ is used for the GaAs deposition flow, it does not interfere with the reactions leading to the epitaxial deposition of GaAs and is, therefore, particularly convenient. However, $AsCl_3$ is not unique. Reactive gases which do not interfere with the basic GaAs deposition process and which react with chromium oxides to form volatile chromium containing compounds are acceptable.

Figure 2:
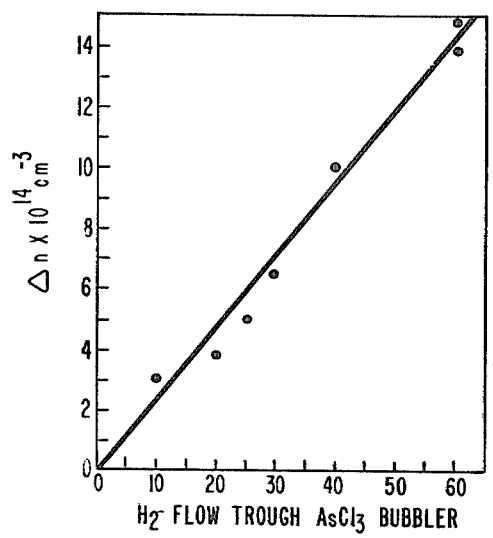
FIG. 2 is a graph indicating reduction in carrier concentration from the inherent n-type background levels produced by the subject invention.

The amount of chromium dopant eventually incorporated in the GaAs epitaxial layer depends on the reaction conditions. These reaction conditions include the gas flow of the component which reacts with chromium oxide, the concentration of this component, and the quantity of the dopant source contacted with this reacting gas. The precise reaction conditions to achieve a desired resistivity are determined with a control sample using the capacitance measuring technique discussed above. The amount of $AsCl_3$ used naturally depends on the background carrier level in the GaAs which must be compensated. The amount of $AsCl_3$ contacting the dopant source and dopant source temperature determine the final resistivity and are somewhat interdependent. An adjustment in one reaction parameter often requires an adjustment in another to maintain the same resistivities. As discussed, a controlled sample is advantageously utilized to determine the precise reaction conditions. However, typical reaction parameters are shown in FIG. 2 for a dopant source heated to 500 degrees C.—useful dopant temperatures are in the range 300 to 800 degrees C. Data in FIG. 2 gives the reduction in carrier concentration from the inherent n-type background levels which would be obtained if no chromium dopant was incorporated versus the $H_2$ flow rate through an $AsCl_3$ bubbler held at a temperature of 18.3 degrees C. The flow from the bubbler has an $AsCl_3$ mole fraction of about $10^{-2}$. This flow is later diluted with additional $H_2$ before flowing over the dopant source so that the total flow is 125 cc/min.

The growth process is continued until the desired thickness of semi-insulating GaAs is obtained. Typically, thicknesses in the range 2 to 10 μm are desired for FET applications. Thicker layers, although possibly advantageous, are generally uneconomical, since growth rates of about 0.2 μm per minute are encountered. Thicker layers generally require unacceptably long growth times. Thinner layers usually do not adequately prevent the contamination problems which the semi-insulating layer is grown to avoid. After growth of the semi-insulating GaAs region an active region is subsequently deposited when fabrication of FETs are contemplated. This deposition usually occurs in the same apparatus so that contamination problems at the interface are avoided. Conventional techniques such as described in H. M. Cox and J. V. DiLorenzo, *Proc. 6th International Symp.*, "Gallium Arsenide and Related Compounds", p. 4, St. Louis, 1976, (London and Bristol; Institute of Physics) are utilized for this process.

The following examples illustrate conditions which are acceptable for the practice of the invention. Additionally, it is shown in the following examples that chromium oxide dopant sources obtained by methods other than by CVD are not useful in the subject process.

EXAMPLE 1

Substrates 0.022 inch thick were sliced from bulk single crystals of chromium doped semi-insulating GaAs which were obtained from commercial sources. The crystals were sliced 6 degrees off the {100} crystallographic plane toward the {111}A plane. The substrates were then polished in a 1000 to 1 methanol/bromine polishing mixture on both surfaces until a final thickness of 0.015 inch was obtained.

The substrates were sequentially immersed in acetone and methanol. During each immersion, the substrates were scrubbed with a cotton swab. After these treatments, the substrates were blown dry with dry hot nitrogen, and then boiled sequentially in acetone, trichloroethylene, and finally methanol. The substrates were soaked for 2 minutes in concentrated hydrochloric acid, rinsed in methanol, and etched for 90 seconds in a solution of 5 parts sulfuric acid, 1 part hydrogen peroxide, and 1 part water. The substrates were finally rinsed in deionized water and spun dry for 5 minutes.

The deposition apparatus (shown schematically in FIG. 1) was prepared by first utilizing heating coils, 50, to establish a temperature profile and temperature maximum in the reaction chamber as indicated in FIG. 1. A water jacket around bubbler, 8, (not indicated for clarity) was filled with a cooled water/methanol mixture to maintain the temperature of this bubbler at 0 degrees C. By a similar expedient, bubbler, 53, was maintained at 8.3 degrees C. and bubbler, 52, was maintained at 18.3 degrees C. Hydrogen purified by passage through a silver palladium diffuser was continuously introduced into manifold 56 unless otherwise indicated.

Valves 30, 31, and 32 were positioned 90 degrees from their position shown in FIG. 1 so that tubes 33 and 34, 35 and 36, and 37 and 38 were connected. Valve 39 remained in the position shown in FIG. 1. Variable leak valves 40, 41, 42, and 43 were adjusted so that flowmeters 44, 45, 46, and 47 read respectively 65 cc/min, 60 cc/min, 65 cc/min and 490 cc/min of hydrogen. Valve 31 was positioned so that the connections for this valve were as indicated in FIG. 1. The valve, 31, was left in that position for 1 minute and then rotated 90 degrees to connect tubes 35 and 36. Thus, a dopant source, 5, was established by CVD.

The hydrogen introduction into manifold, 56, was terminated and helium of purity 99.999 was introduced into this manifold. The valves 40, 41, 42 and 43 were adjusted so that flowmeters 44, 45, 46, and 47 read respectively 100 cc/min, 100 cc/min, 100 cc/min, and 600 cc/min.

After a flow of 10 minutes, endcap 60 was then removed. The substrate, 11, was placed on substrate holder, 61, and inserted into the position as shown in FIG. 1 with the endcap replaced. The helium flow as indicated previously was maintained for an additional 10 minutes after replacement of the endcap. Introduction of helium into manifold, 56, was terminated and purified hydrogen, as discussed previously, was again introduced into this manifold. The flow rates as adjusted by valves 40, 41, 42, and 43 wee again set so that flowmeters 44, 45, 46, and 47 indicated 60 cc/min, 550 cc/min, 60 min, and 10 cc/min respectively. Valves 30, 31, 32, and 39 were positioned so that tubes 33 and 73, 35 and 36, 37 and 75, and 34 and 64 were interconnected. The flow as set was continued 4 minutes to etch in situ the substrate, 11. Valves 40, 41, 42, and 43, were then adjusted so that the flowmeters 44, 45, 46, and 47 read respectively 65 cc/min, 60 cc/min, 65 cc/min and 490 cc/min.

Valve 39 was positioned so that it was again as indicated in FIG. 1. The adjustment to valve 39 began the Cr-doping of the GaAs layer growth. (It is assumed for this growth that the boat, 13, has previously been filled with Ga which has been saturated with $AsCl_3$. This saturation was done at a time before the actual growth run. This is expediently done by establishing the temperature profile indicated in FIG. 1, except the maximum temperature of that profile was raised to approximately 825 degrees C. The bubbler temperature in bubbler, 53, was similarly raised to a temperature of 18.3 degrees C. The hydrogen flow rates used during GaAs deposition were established. Valves 32 and 39 were positioned as shown in FIG. 1, valves 30 and 31 were positioned 90 degrees from the orientation shown in FIG. 1 to connect tubes 33 and 34, and 35 and 36 respectively. This flow was maintained as wellknown in the art for times which depend on the quantity of gallium to be saturated. Typically for a gallium weight in the range 100 to 130 grams the flow was maintained for a time period in the range 4 to 8 hours. Following the saturation of the gallium, and before the apparatus is used again, the tube was cleaned by conventional methods. For example, the furnace is moved relative to the reaction chamber so that the gallium source is no longer heated. Arsenic trichloride was then introduced from bubblers, 53 and 52, (with the valves, 30 and 32, set to positions shown in FIG. 1 until deposits on the reaction chamber are no longer visible.)

The Cr-doped GaAs deposition is continued until a Cr-doped GaAs thickness of approximately 18 $\mu$m was obtained. Valve 30 was positioned to connect tubes 33 and 34, thus terminating the chrome doping of the GaAs layer. For FET device applications, an n+ GaAs layer is then grown on the chrome doped layer without interruption of the growth procedure. This was accomplished by introducing a mixture 600 parts per million $H_2S$ in hydrogen through leak valve, 70, at a level previously determined by a controlled run to give a dopant level in the range $1-3 \times 10^{18}$ cm$^{-3}$. The growth was continued for approximately 10 minutes to yield a layer thickness between approximately 2 $\mu$m and 3 $\mu$m. The growth was terminated by withdrawing the substrate from the furance.

Figure 3:
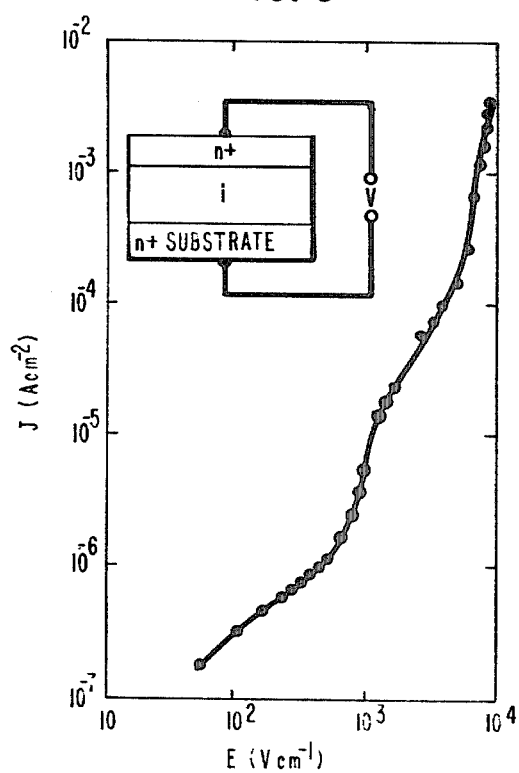
FIG. 3 is a graph indicating resistivity obtained under typical growth conditions.

Electric field-current density characteristics for the semi-insulating GaAs layers made by the subject process were measured. These measurements were done by growing the semi-insulating GaAs layers as described in this example except an n+ substrate (typically having a majority carrier concentration of $2 \times 10^{18}$ cm$^{-3}$ and thickness 400 $\mu$m) was utilized instead of a semi-insulating GaAs substrate. The epitaxial n+ region grown on the chrome doped GaAs layer as described in this example having a dopant concentration $2 \times 10^{18}$ and having a thickness of 2½ $\mu$m was utilized. The E-J characteristics obtained are shown in FIG. 3. The profile of the dopant in the Cr-doped layer showed no n-type dopant spike.

EXAMPLE 2

The deposition of a chrome doped GaAs layer was attempted by using $Cr_2O_3$ as the dopant source instead of CVD deposited chromium oxide. This was done by inserting powdered $Cr_2O_3$ (obtained from Atomergic Chemetals Co.) into the position indicated as 5 in FIG. 1. No CVD deposition of chromium oxide was utilized. The GaAs deposition precursor gas flow was established as indicated in Example 1. The semi-insulating GaAs layer obtained had a large n-type dopant spike in the concentration range $1 \times 10^{16}$ to $1 \times 10^{18}$ cm$^{-3}$ in the portion of the GaAs grown during the initiation and termination of the flow of arsenic trichloride over the $Cr_2O_3$. These spikes made the layer unsatisfactory for most device applications.

I claim:

1. A process for depositing a chrome doped epitaxial layer of GaAs on a substrate comprising the steps of combining a gas phase composition which contains a GaAs precursor with a chromium containing dopant to form a deposition composition and forming said epitaxial layer by contacting said substrate with said deposition composition under conditions which result in epitaxial growth of GaAs on said substrate characterized in that a dopant source is obtained by the chemical vapor deposition of a chromium oxide and said chromium containing dopant is then formed by passing a reactive gas which forms volatile chromium containing compounds with chromium oxide over said dopant source wherein said reactive gas is substantially absent over said dopant source during said chemical vapor deposition of said dopant source.

2. The process of claim 1 wherein said substrate comprises GaAs.

3. The process of claim 1 wherein said reactive gas comprises $AsCl_3$.

4. The process of claim 1 wherein said dopant source is obtained by the decomposition of $CrO_2Cl_2$.

5. The process of claim 1 wherein said gas phase composition is obtained by passing $AsCl_3$ over Ga.

6. The process of claim 5 wherein said Ga is heated to a temperature in the range 700 to 850 degrees C.

7. The process of claim 1 wherein the resistivity of said doped epitaxial layer is greater than $10^3$ ohm-cm.

* * * * *

UNITED STATES PATENT AND TRADEMARK OFFICE
CERTIFICATE OF CORRECTION

PATENT NO. : 4,204,893
DATED : May 27, 1980
INVENTOR(S) : Herbert M. Cox

It is certified that error appears in the above-identified patent and that said Letters Patent are hereby corrected as shown below:

Column 1, line 36, "directlyon" should be --directly on--. Column 7, line 2, "wee" should be --were--. Column 7, line 4, "60 min" should be --60 cc/min--. Column 7, line 28, "wellknown" should be --well known--.

Signed and Sealed this

Second Day of September 1980

[SEAL]

Attest:

SIDNEY A. DIAMOND

Attesting Officer

Commissioner of Patents and Trademarks